US012660185B2

(12) United States Patent (10) Patent No.: US 12,660,185 B2
Zhang et al. (45) Date of Patent: Jun. 16, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Wenbo Zhang, Wuhan (CN); Kai Yu, Wuhan (CN); Zhiyong Lu, Wuhan (CN); Sheng Peng, Wuhan (CN); Zhaohui Cheng, Wuhan (CN); Zhangyi Li, Wuhan (CN); Jing Gao, Wuhan (CN); Lei Xue, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 392 days.

(21) Appl. No.: 18/208,687

(22) Filed: Jun. 12, 2023

(65) Prior Publication Data

US 2024/0206167 A1 Jun. 20, 2024

Related U.S. Application Data

(60) Provisional application No. 63/433,112, filed on Dec. 16, 2022.

(30) Foreign Application Priority Data

May 24, 2023 (CN) .......................... 202310613792.9

(51) Int. Cl.
*H10B 43/27* (2023.01)
*H10B 41/27* (2023.01)
*H10B 41/41* (2023.01)
*H10B 43/40* (2023.01)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 43/27; H10B 43/40; H10B 41/27; H10B 41/41
See application file for complete search history.

(56) References Cited

U.S. PATENT DOCUMENTS 12,191,269 B2 * 1/2025 Yang ..................... H01L 23/481
12,412,855 B2 * 9/2025 Zhang ................. H01L 25/0657

* cited by examiner

*Primary Examiner* — Richard A Booth
(74) *Attorney, Agent, or Firm* — BAYES PLLC

(57) ABSTRACT

Three-dimensional (3D) memory devices and methods for forming the same are disclosed. In certain aspects, a 3D memory device includes a first semiconductor structure including alternating first dielectric layers and first conductive layers, an array common source (ACS) film over the first semiconductor structure, a second semiconductor structure over the ACS film, and a channel structure extending in the first semiconductor structure, the ACS film, and the second semiconductor structure in a first direction. The second semiconductor structure includes alternating second dielectric layers and second conductive layers. The channel structure is electrically connected to the ACS film.

14 Claims, 26 Drawing Sheets

<u>300</u>

405-3
407
405-1

303-3
303-5
402

420
400

405-3

407

405-1

401-5

403-1

420

400

303-3

303-5

402

405-3

407

405-1

403-5

303-3

303-5

402

420

400

405-3
407
405-1

401-7

403-5

305-3
305-5

420

410

303-3
303-5

402

400

X

Z

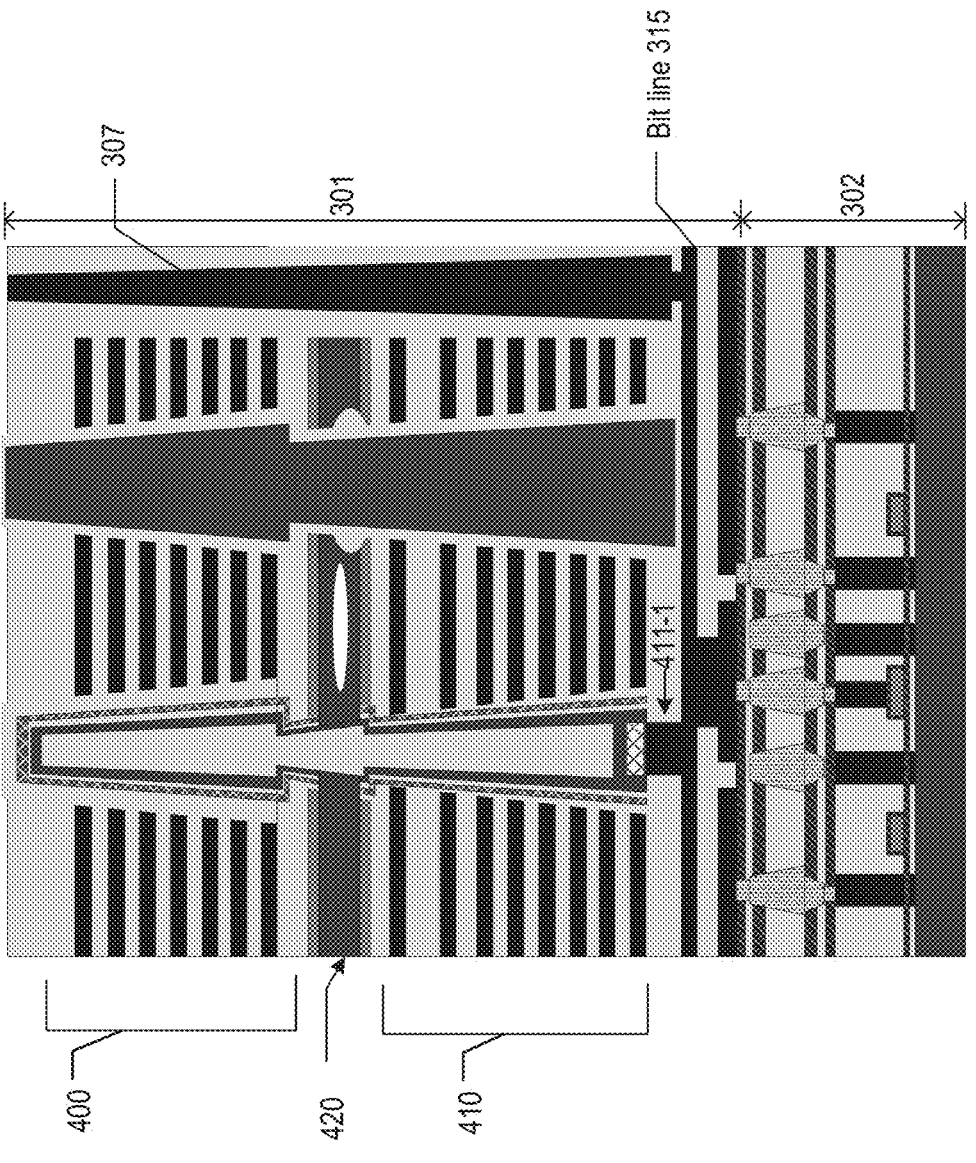
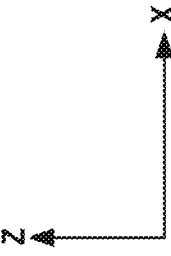
FIG. 4T

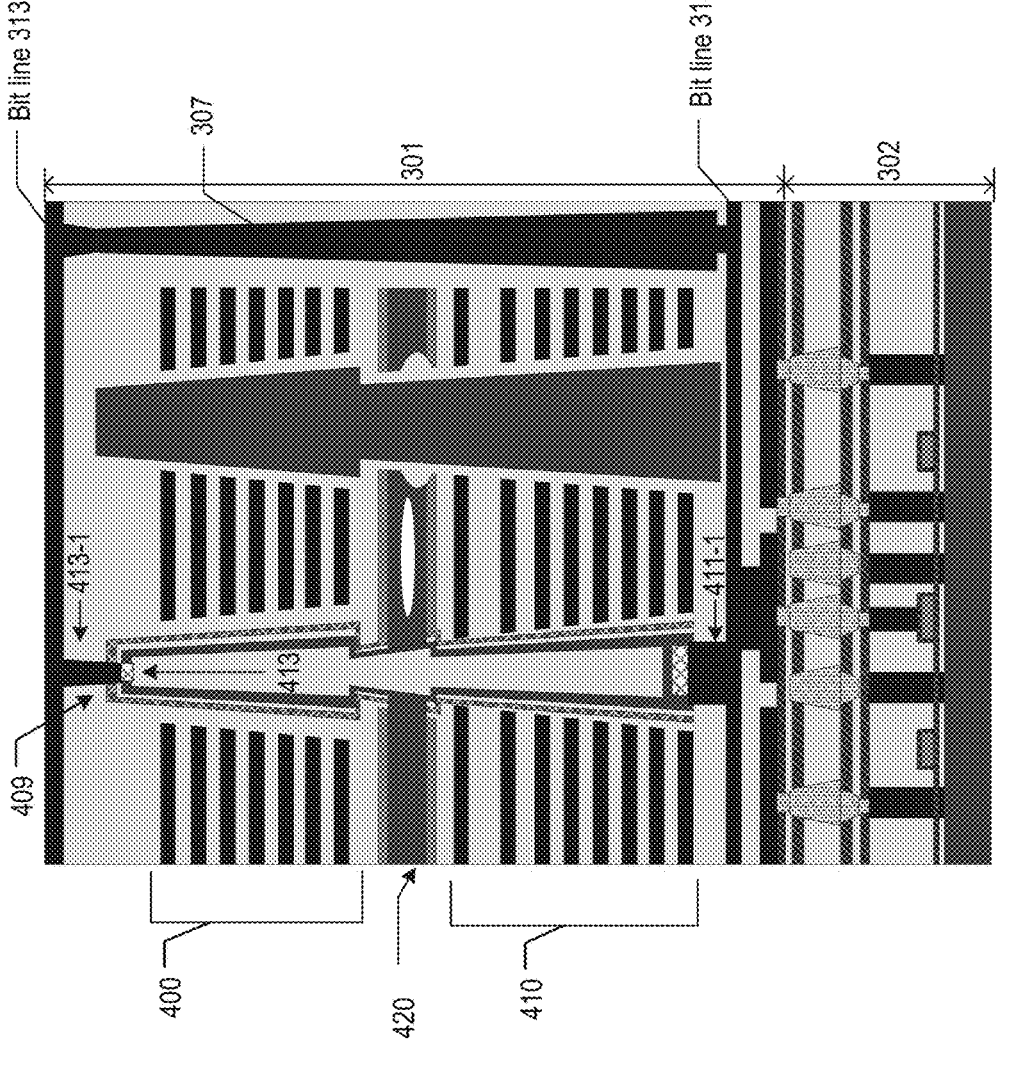
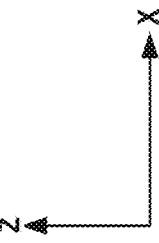
FIG. 4U

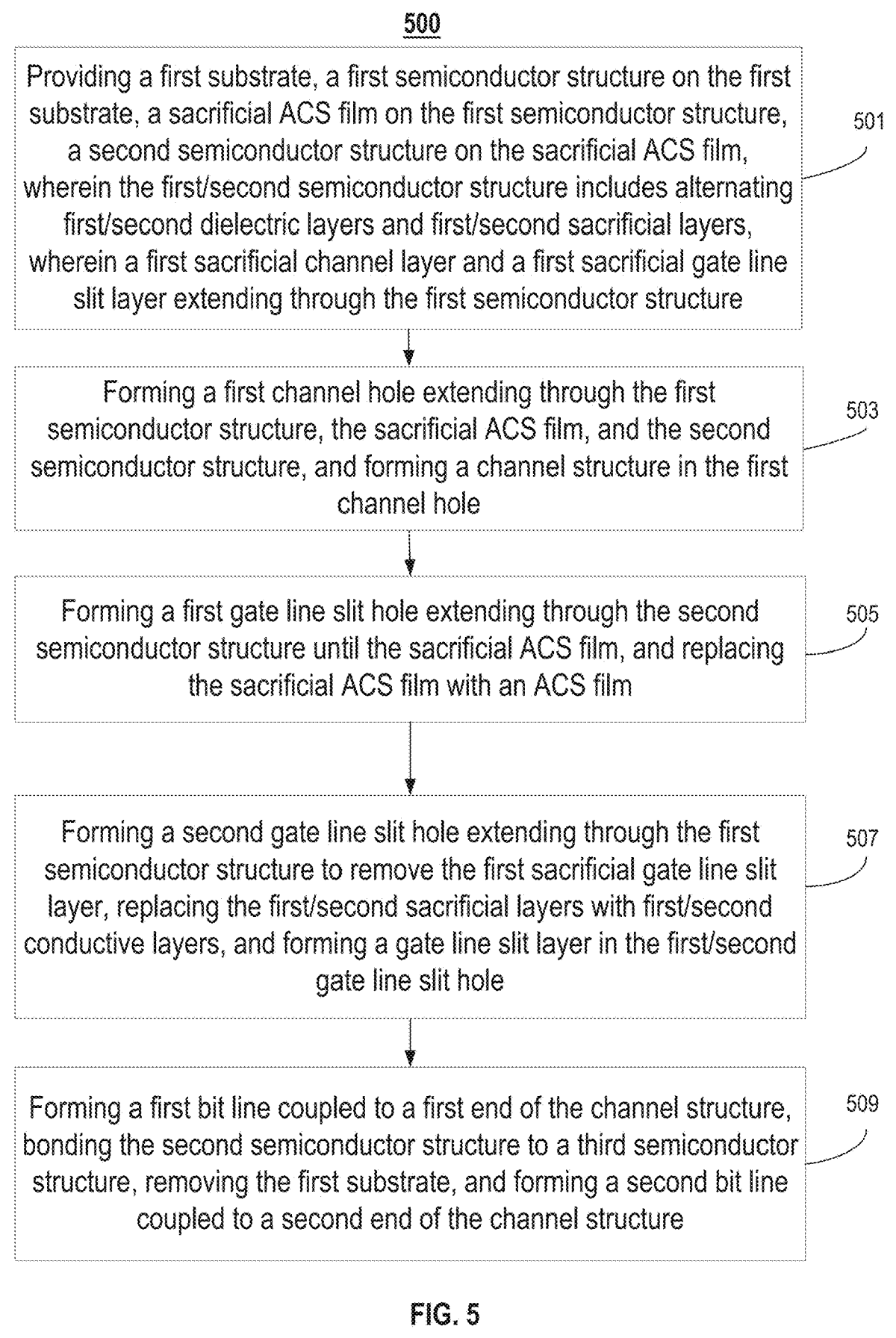

500

Providing a first substrate, a first semiconductor structure on the first substrate, a sacrificial ACS film on the first semiconductor structure, a second semiconductor structure on the sacrificial ACS film, wherein the first/second semiconductor structure includes alternating first/second dielectric layers and first/second sacrificial layers, wherein a first sacrificial channel layer and a first sacrificial gate line slit layer extending through the first semiconductor structure    501

Forming a first channel hole extending through the first semiconductor structure, the sacrificial ACS film, and the second semiconductor structure, and forming a channel structure in the first channel hole    503

Forming a first gate line slit hole extending through the second semiconductor structure until the sacrificial ACS film, and replacing the sacrificial ACS film with an ACS film    505

Forming a second gate line slit hole extending through the first semiconductor structure to remove the first sacrificial gate line slit layer, replacing the first/second sacrificial layers with first/second conductive layers, and forming a gate line slit layer in the first/second gate line slit hole    507

Forming a first bit line coupled to a first end of the channel structure, bonding the second semiconductor structure to a third semiconductor structure, removing the first substrate, and forming a second bit line coupled to a second end of the channel structure    509

FIG. 5

600
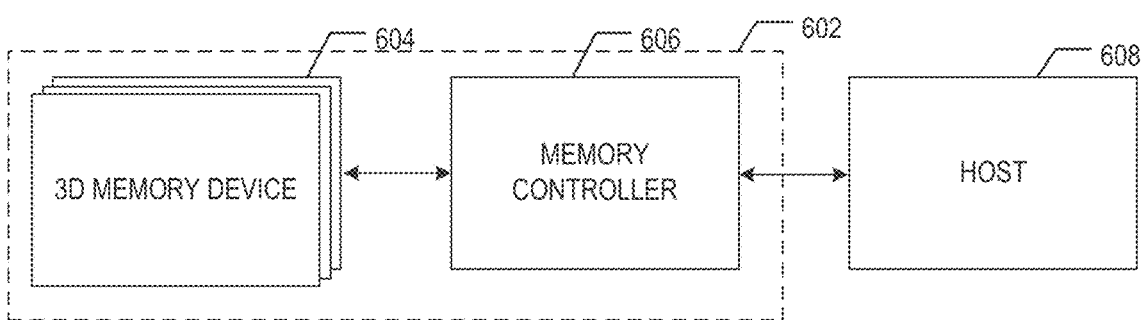
FIG. 6
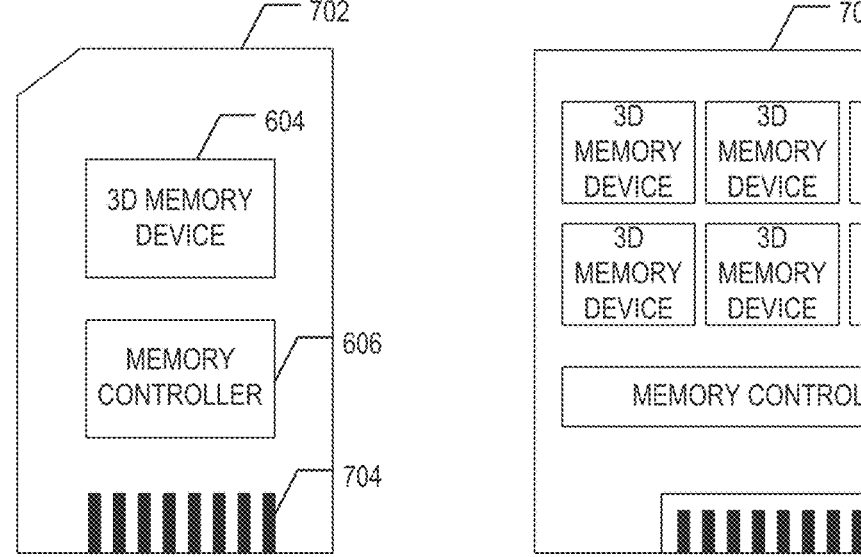
FIG. 7A                    FIG. 7B

THREE-DIMENSIONAL MEMORY DEVICES AND METHODS FOR FORMING THE SAME

CROSS-REFERENCE TO RELATED APPLICATIONS

This application claims the benefit of priorities to U.S. Provisional Application No. 63/433,112, filed on Dec. 16, 2022, and C.N. Application No. 202310613792.9, filed on May 24, 2023, both of which are incorporated herein by reference in their entireties.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a three-dimensional (3D) memory device includes a first semiconductor structure including alternating first dielectric layers and first conductive layers, an array common source (ACS) film over the first semiconductor structure, a second semiconductor structure over the ACS film, and a channel structure extending in the first semiconductor structure, the ACS film, and the second semiconductor structure in a first direction. The second semiconductor structure includes alternating second dielectric layers and second conductive layers. The channel structure is electrically connected to the ACS film.

In some implementations, the 3D memory device further includes a contact structure coupled between a first end of the channel structure and a second end of the channel structure.

In some implementations, the 3D memory device further includes a first bit line extending in a second direction perpendicular to the first direction, and a second bit line extending in the second direction. The contact structure is coupled to the first end of the channel structure via the first bit line, and the contact structure is coupled to the second end of the channel structure via the second bit line.

In some implementations, the first bit line is in contact with a first doped portion of the channel structure at the first end of the channel structure, and the second bit line is in contact with a second doped portion of the channel structure at the second end of the channel structure.

In some implementations, a doping type of the first doped portion and that of the ACS film are the same, or a doping type of the second doped portion and that of the ACS film are the same.

In some implementations, the 3D memory device further includes a first interlayer between the ACS film and the first semiconductor structure, and a second interlayer between the ACS film and the second semiconductor structure.

In some implementations, the ACS film includes p-doped polysilicon.

In some implementations, the ACS film is formed between the first semiconductor structure and the second semiconductor structure.

In some implementations, the channel structure includes a first portion, a second portion, and a third portion between the first portion and the second portion, wherein the first portion extends in the first semiconductor structure, the second portion extends in the second semiconductor structure, and the third portion connected to the ACS film.

In some implementations, the channel structure further includes a channel layer, wherein the ACS film is in contact with the channel layer.

In some implementations, the channel structure further includes a memory film at least partially surrounds the channel layer. The memory film includes a tunneling layer, a storage layer, and a blocking layer arranged radially from inside out.

In some implementations, the channel layer further includes an exposed portion not covered by the memory film, and the ACS film is in contact with the channel layer via the exposed portion.

In some implementations, the 3D memory device further includes a third semiconductor structure. The third semiconductor structure includes a peripheral circuit, and a first bonding layer. The first semiconductor structure and the third semiconductor structure are bonded via the first bonding layer.

In another aspect, a memory system includes a three-dimensional (3D) memory device, and a memory controller coupled to the 3D memory device and configured to control operations of the 3D memory device. The 3D memory device includes a first semiconductor structure including alternating first dielectric layers and first conductive layers, an array common source (ACS) film over the first semiconductor structure, a second semiconductor structure over the ACS film, and a channel structure extending in the first semiconductor structure, the ACS film, and the second semiconductor structure in a first direction. The second semiconductor structure includes alternating second dielectric layers and second conductive layers. The channel structure is electrically connected to the ACS film.

In still another aspect, a method of forming a three-dimensional (3D) memory device includes providing a first substrate, a first semiconductor structure over the first substrate, a sacrificial array common source (ACS) film over the first semiconductor structure, a second semiconductor structure over the sacrificial ACS film, forming a through channel hole extending through the first semiconductor structure, the sacrificial ACS film, and the second semiconductor structure, and forming a channel structure in the through channel hole, and forming a gate line slit hole extending through the first semiconductor structure, the sacrificial ACS film, and the second semiconductor structure, replacing the first sacrificial layers with first conductive layers, replacing the second sacrificial layers with second conductive layers, and replacing the sacrificial ACS film with an ACS film. The first semiconductor structure includes alternating first dielectric layers and first sacrificial layers, and the second semiconductor structure includes alternating second dielectric layers and second sacrificial layers.

In some implementations, the forming the gate line slit hole extending through the first semiconductor structure, the sacrificial ACS film, and the second semiconductor structure, replacing the first sacrificial layers with the first conductive layers, replacing the second sacrificial layers with the second conductive layers, and replacing the sacrificial ACS film with the ACS film further includes: forming a first gate line slit hole extending through the second semiconductor structure until the sacrificial ACS film, and replacing the sacrificial ACS film with the ACS film, and forming a second gate line slit hole extending through the first semiconductor structure to remove a first sacrificial gate line slit layer, replacing the first sacrificial layers with the first conductive layers, replacing the second sacrificial layers with the second conductive layers.

In some implementations, the forming the first gate line slit hole extending through the second semiconductor structure until the sacrificial ACS film, and replacing the sacrificial ACS film with the ACS film further includes forming the first gate line slit hole extending through the second semiconductor structure until a first interlayer, forming a first etch stop layer in the first gate line slit hole and forming a second etch stop layer over the first etch stop layer, etching through a bottom surface of the first etch stop layer and the second etch stop layer until the sacrificial ACS film, removing the sacrificial ACS film to form an ACS vacancy, removing a portion of a memory film of the channel structure via the ACS vacancy, and filling the ACS vacancy with the ACS film.

In some implementations, forming the second gate line slit hole extending through the first semiconductor structure to remove the first sacrificial gate line slit layer includes applying a dry etching to remove the first sacrificial gate line slit layer until the first substrate.

In some implementations, providing the first substrate, the first semiconductor structure over the first substrate, the sacrificial ACS film over the first semiconductor structure, the second semiconductor structure over the sacrificial ACS film, and forming the through channel hole extending through the first semiconductor structure, the sacrificial ACS film, and the second semiconductor structure, and forming the channel structure in the through channel hole further includes: forming a first sacrificial channel structure and a first sacrificial gate line slit layer extending through the first semiconductor structure, forming the sacrificial ACS film over the first semiconductor structure, forming the second semiconductor structure over the sacrificial ACS film, etching through the first semiconductor structure, the sacrificial ACS film, and the second semiconductor structure to form the through channel hole, and forming the channel structure in the through channel hole. The first semiconductor structure includes the alternating first dielectric layers and first sacrificial layers, and the second semiconductor structure includes the alternating second dielectric layers and second sacrificial layers.

In some implementations, forming the channel structure in the through channel hole further includes forming a memory film covering a sidewall of the through channel hole, and forming a channel layer filling the through channel hole.

In some implementations, the method further includes forming a first bit line coupled to a first end of the channel structure, bonding the second semiconductor structure to a third semiconductor structure, removing the first substrate, and forming a second bit line coupled to a second end of the channel structure.

In some implementations, the method further includes forming a contact structure coupled with the first bit line and the second bit line.

In some implementations, forming the first bit line coupled to the first end of the channel structure further includes, after forming the contact structure, ion-implanting a first portion of the channel structure at the first end of the channel structure, and forming the first bit line coupled to the first portion of the channel structure at the first end of the channel structure. The first bit line is coupled between the channel structure and the contact structure.

In some implementations, bonding the second semiconductor structure to the third semiconductor structure further includes forming a first bonding layer coupled to the second semiconductor structure, forming a second bonding layer coupled to the third semiconductor structure, and bonding the first bonding layer to the second bonding layer.

In some implementations, removing the first substrate and forming the second bit line coupled to the second end of the channel structure further includes removing the first substrate to expose the contact structure, ion-implanting a second portion of the channel structure at the second end of the channel structure, and forming the second bit line coupled to the second portion of the channel structure at the second end of the channel structure, wherein the second bit line is coupled between the channel structure and the contact structure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5 illustrates a flowchart of an exemplary method for forming a 3D memory device, according to some aspects of the present disclosure.

FIG. 6 illustrates a block diagram of an exemplary system having a 3D memory device, according to some aspects of the present disclosure.

FIG. 7A illustrates a diagram of an exemplary memory card having a 3D memory device, according to some aspects of the present disclosure.

FIG. 7B illustrates a diagram of an exemplary solid-state drive (SSD) having a 3D memory device, according to some aspects of the present disclosure.

Figure 1:
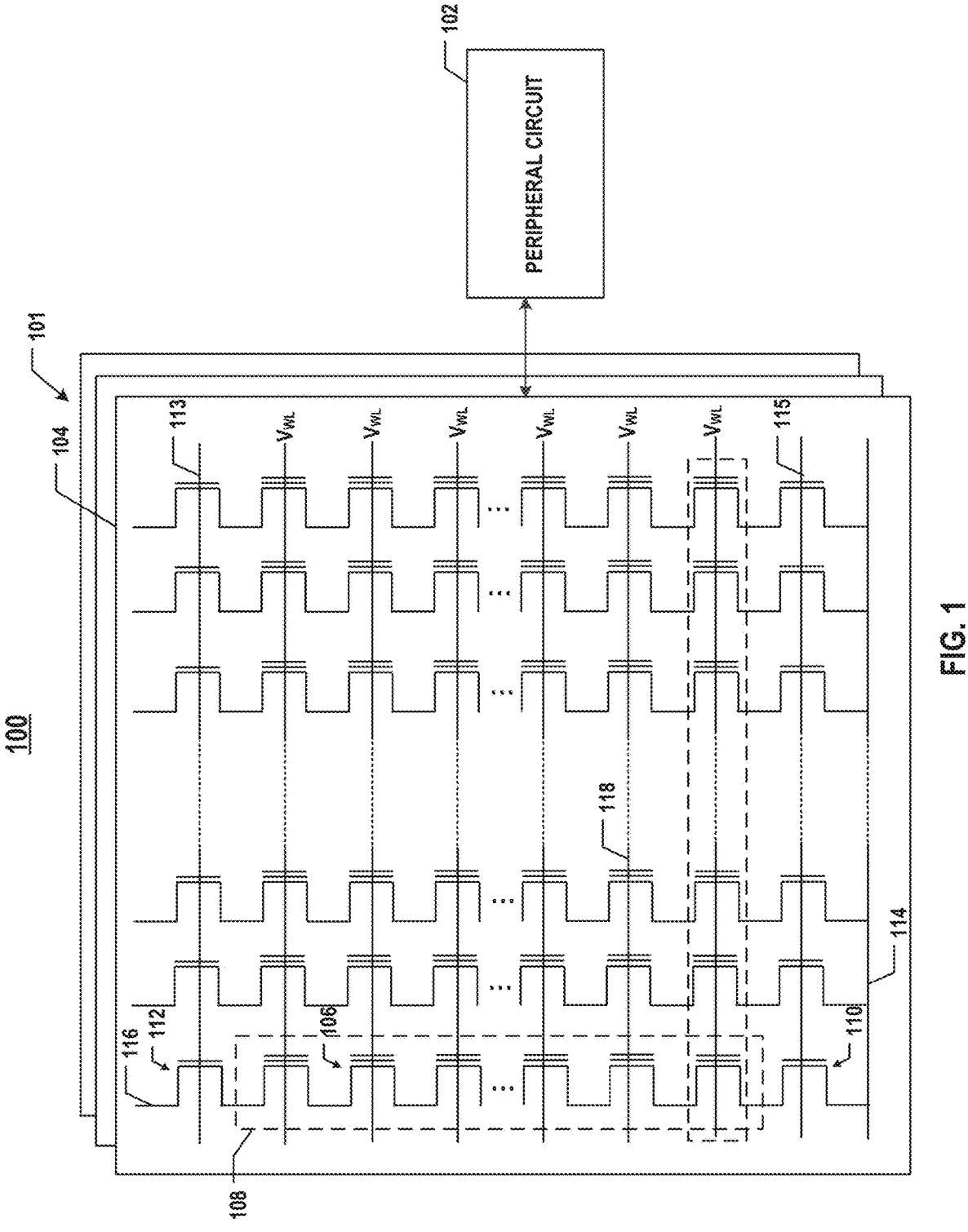
FIG. 1 illustrates a schematic circuit diagram of an exemplary 3D memory device including peripheral circuits, according to some implementations of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (e.g., single crystalline silicon, c-Si), silicon germanium (SiGe), gallium arsenide (GaAs), germanium (Ge), silicon on insulator (SOI), or any other suitable materials. Alternatively, the substrate can be made from an electrically non-conductive material, such as a glass, a plastic, or a sapphire wafer.

As used herein, the term "x-," "y-," and "z-," axes are used herein to illustrate the spatial relationships of the components in the 3D memory device according to some implementation of the present disclosure. Substrate may include two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line extending direction, and the y-direction is the bit line extending direction. The z-axis is perpendicular to both the x- and y-axes.

As used herein, whether one component (e.g., a layer or a device) is "on," "above," or "below" another component (e.g., a layer or a device) of a semiconductor device (e.g., 3D memory device) is determined relative to the substrate of the semiconductor device (e.g., substrate) in the z-direction (the vertical direction perpendicular to the x-y plane) when the substrate is positioned in the lowest plane of the semiconductor device in the z-direction. The same notion for describing spatial relationships is applied throughout the present disclosure.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow.

As used herein, the term "3D memory device" refers to a semiconductor device with memory cell transistors on a laterally-oriented substrate so that the memory cells extend in the vertical direction with respect to the substrate. As used herein, the term "vertical/vertically" means nominally perpendicular to the lateral surface of a substrate.

In some 3D NAND memory devices, memory cells of a memory array are connected to each other using vertical channels, and are drawn out by unified array common source (ACS) and drain metal line (e.g., bit line). The channel saturation current (Ion) of the memory device is an important parameter characterizing the performance of the memory device. In some 3D NAND memory devices, the channel saturation current Ion of the memory device will have a great impact on the threshold voltage (Vt) distribution, thereby reducing the performance of the memory device (e.g., generating more program/read/verify errors). Furthermore, because the bit line is connected to the page buffer, the level of the channel saturation current Ion will also affect the function of the page buffer. For example, if the channel saturation current of the memory device is too low, the function of the page buffer will also fail, and a series of reliability issues of the memory device will occur. As the number of layers in the 3D NAND memory device gradually increases, the channel length gradually increases, causing the channel saturation current to decrease, thereby reducing the reliability and performance of the memory device in several aspects. Therefore, it is a major challenge to maintain or increase the channel saturation current of the 3D NAND memory device with more layers being stacked.

To address one or more of the aforementioned issues, the present disclosure introduces a solution in which the ACS film is formed in the middle of the memory array, and two bit lines are formed on both sides (e.g., top and bottom) of the memory array. The equivalent channel length of the memory array of the memory device may be reduced, thereby increasing the channel saturation current Ion significantly. In some implementations, operations in the present disclosure may be introduced to form the ACS film in the middle of the memory array and connect the top and bottom bit lines by using a contact structure, such that the channel length of the memory array of the memory device is roughly halved by having two channels electrically connected in parallel. Therefore, the reliability and performance of the 3D memory devices can be improved.

Figure 3:
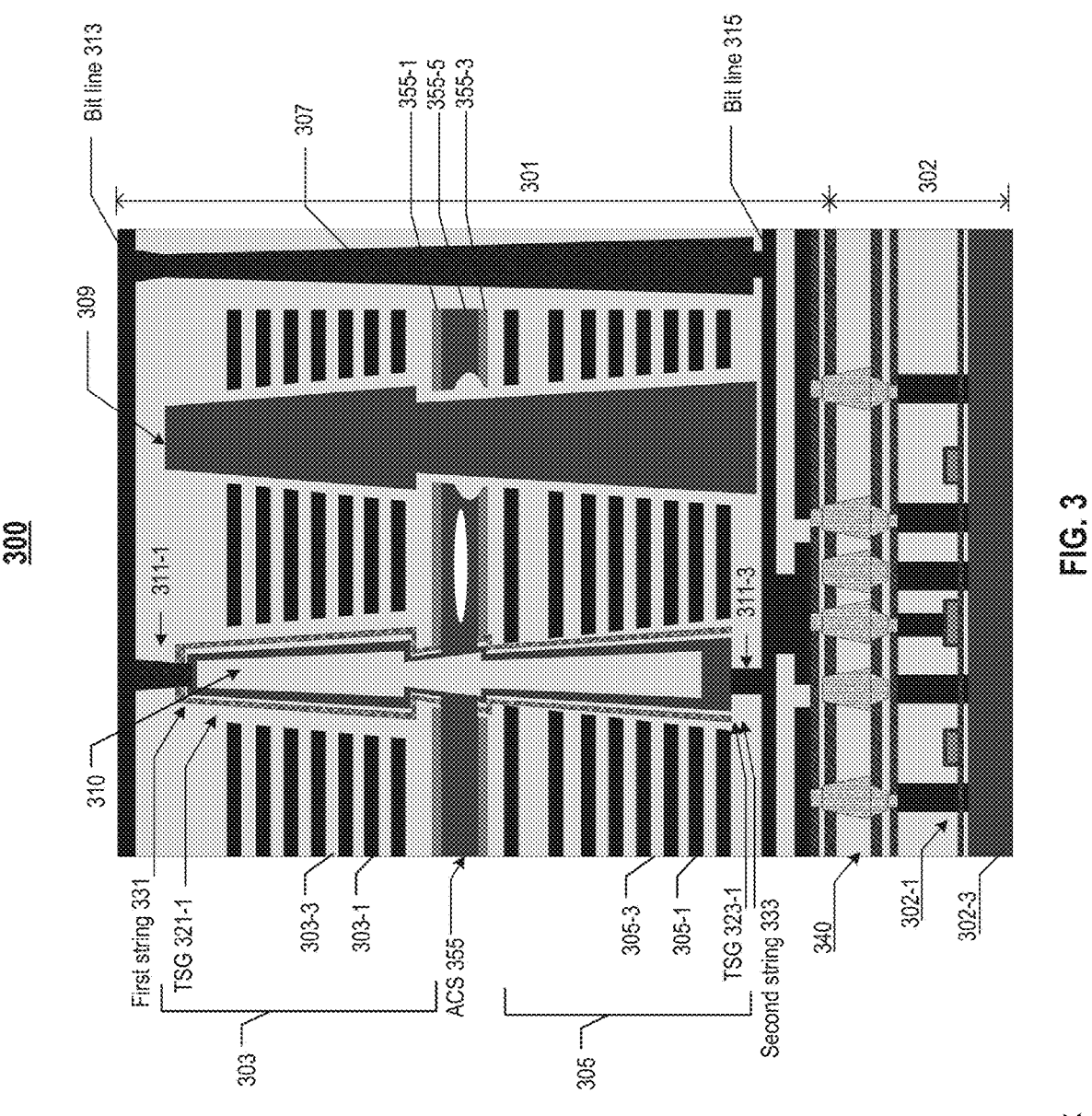
FIG. 3 illustrates a cross-sectional view of an exemplary 3D memory device, according to some implementations of the present disclosure.

FIG. 1 illustrates a schematic circuit diagram of a 3D memory device 100 including peripheral circuits, according to some aspects of the present disclosure. 3D memory device 100 can include a memory cell array 101 and peripheral circuits 102 coupled to memory cell array 101. Memory cell array 101 can be a NAND Flash memory cell array in which memory cells 106 are provided in the form of an array of 3D NAND memory strings 108 each extending vertically above a substrate (not shown). In some implementations, each 3D NAND memory string 108 includes a plurality of memory cells 106 coupled in series and stacked vertically. Each memory cell 106 can hold a continuous, analog value, such as an electrical voltage or charge, that depends on the number of electrons trapped within a region of memory cell 106. Each memory cell 106 can be either a floating gate type of memory cell including a floating-gate transistor or a charge trap type of memory cell including a charge-trap transistor. Each array of 3D NAND memory strings 108 can include one or more 3D memory devices. For example, FIG. 3 illustrates an exemplary 3D memory device 300.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each 3D NAND memory string 108 can include a source select gate (SSG) transistor 110 at its source end and a drain select gate (DSG) transistor 112 at its drain end. SSG transistor 110 and DSG transistor 112 can be configured to activate selected 3D NAND memory strings 108 (columns of the array) during read and program operations. In some implementations, the sources of SSG transistors 110 of 3D NAND memory strings 108 in the same block 104 are coupled through a same source line (SL) 114, e.g., a common SL, for example, to the ground. DSG transistor 112 of each 3D NAND memory string 108 is coupled to a respective bit line 116 from which data can be read or programmed via an output bus (not shown), according to some implementations. In some implementations, each 3D NAND memory string 108 is configured to be selected or unselected by applying a select signal (e.g., a select voltage above the threshold voltage of DSG transistor 112) or a deselect signal (e.g., a deselect voltage such as 0 V) to respective DSG transistor 112 through one or more DSG lines 113 and/or by applying a select voltage (e.g., above the threshold voltage of SSG transistor 110) or a deselect voltage (e.g., 0 V) to respective SSG transistor 110 through one or more SSG lines 115.

As shown in FIG. 1, 3D NAND memory strings 108 can be organized into multiple blocks 104, each of which can have a common source line 114. In some implementations, each block 104 is the basic data unit for erase operations, i.e., all memory cells 106 on the same block 104 are erased at the same time. Memory cells 106 can be coupled through word lines 118 that select which row of memory cells 106 is affected by read and program operations. In some implementations, each word line 118 is coupled to a row of memory cells 106, which is the basic data unit for program and read operations. Each word line 118 can be coupled to a plurality of control gates (gate electrodes) at each memory cell 106 in respective row and a gate line coupling the control gates.

Figure 2:
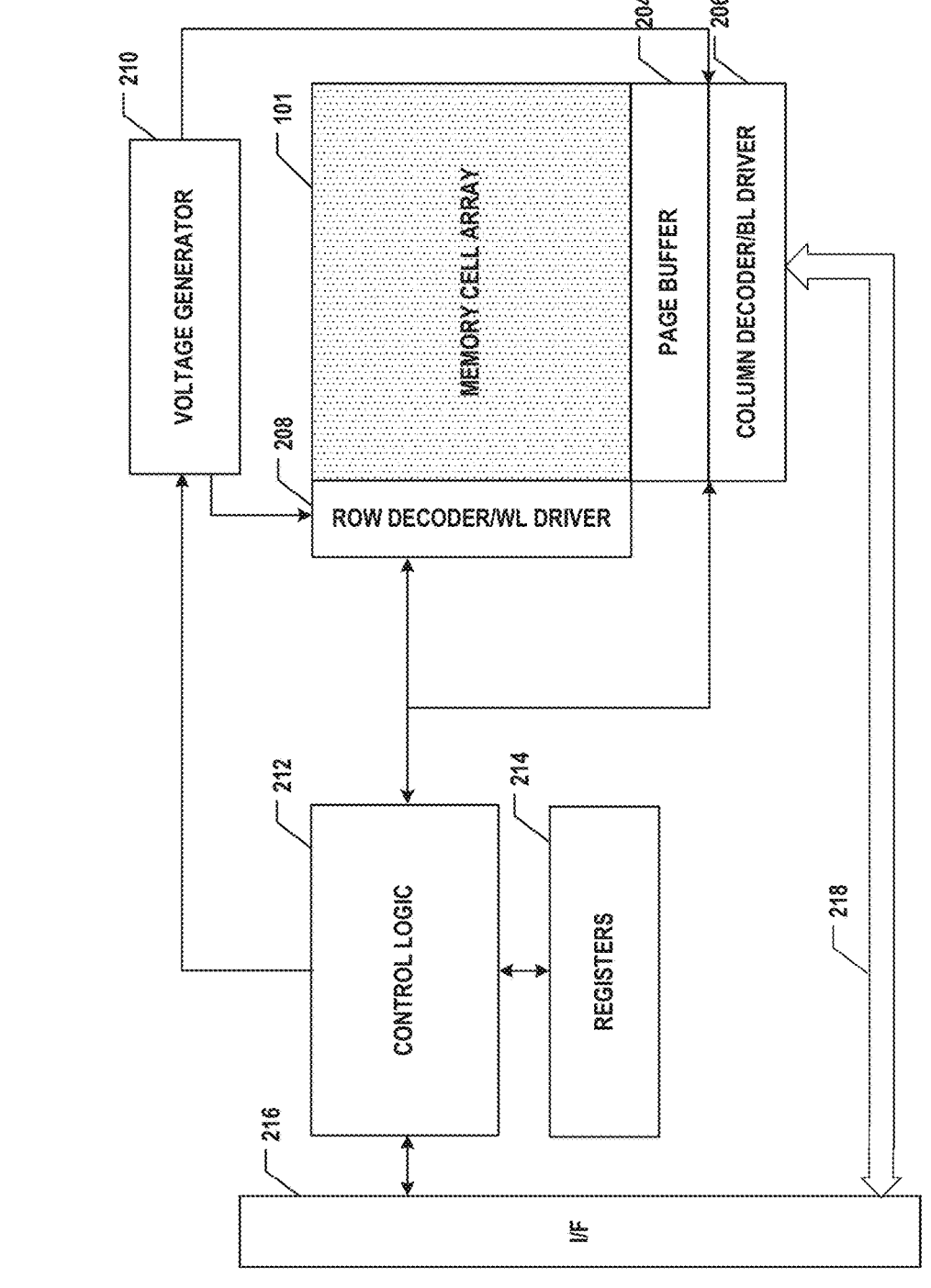
FIG. 2 illustrates a block diagram of an exemplary 3D memory device including a memory cell array and peripheral circuits, according to some implementations of the present disclosure.

Peripheral circuits 102 can be coupled to memory cell array 101 through bit lines 116, word lines 118, source lines 114, SSG lines 115, and DSG lines 113. As described above, peripheral circuits 102 can include any suitable circuits for facilitating the operations of memory cell array 101 by applying and sensing voltage signals and/or current signals through bit lines 116 to and from each target memory cell 106 through word lines 118, source lines 114, SSG lines 115, and DSG lines 113. Peripheral circuits 102 can include various types of peripheral circuits formed using complementary metal-oxide semiconductor (CMOS) technologies. For example, FIG. 2 illustrates some exemplary peripheral circuits 102 including a page buffer 204, a column decoder/bit line driver 206, a row decoder/word line driver 208, a voltage generator 210, control logic 212, registers 214, an interface (I/F) 216, and a data bus 218. It is understood that in some examples, additional peripheral circuits 102 may be included as well.

Page buffer 204 can be configured to buffer data read from or programmed to memory cell array 101 according to the control signals of control logic 212. In one example, page buffer 204 may store one page of program data (write data) to be programmed into one row of memory cell array 101. In another example, page buffer 204 also performs program verify operations to ensure that the data has been properly programmed into memory cells 106 coupled to selected word lines 118.

Row decoder/word line driver 208 can be configured to be controlled by control logic 212 and select or unselect a block 104 of memory cell array 101 and select or unselect a word line 118 of selected block 104. Row decoder/word line driver 208 can be further configured to drive memory cell array 101. For example, row decoder/word line driver 208 may drive memory cells 106 coupled to the selected word line 118 using a word line voltage generated from voltage generator 210. In some implementations, row decoder/word line driver 208 can include a decoder and string drivers (driving transistors) coupled to local word lines and word lines 118.

Voltage generator 210 can be configured to be controlled by control logic 212 and generate the word line voltages (e.g., read voltage, program voltage, pass voltage, local voltage, and verification voltage) to be supplied to memory cell array 101. In some implementations, voltage generator 210 is part of a voltage source that provides voltages at various levels of different peripheral circuits 102 as described below in detail. Consistent with the scope of the present disclosure, in some implementations, the voltages provided by voltage generator 210, for example, to row decoder/word line driver 208 and page buffer 204 are above certain levels that are sufficient to perform the memory operations. For example, the voltages provided to page buffer 204 may be between 2 V and 3.3 V, such as 3.3 V, and the voltages provided to row decoder/word line driver 208 may be greater than 3.3 V, such as between 3.3 V and 30 V.

Column decoder/bit line driver 206 can be configured to be controlled by control logic 212 and select one or more 3D NAND memory strings 108 by applying bit line voltages generated from voltage generator 210. For example, column decoder/bit line driver 206 may apply column signals for selecting a set of N bits of data from page buffer 204 to be outputted in a read operation.

Control logic 212 can be coupled to each peripheral circuit 102 and configured to control operations of peripheral circuits 102. Registers 214 can be coupled to control logic 212 and include status registers, command registers, and address registers for storing status information, command operation codes (OP codes), and command addresses for controlling the operations of each peripheral circuit 102.

Interface 216 can be coupled to control logic 212 and configured to interface memory cell array 101 with a memory controller (not shown). In some implementations, interface 216 acts as a control buffer to buffer and relay control commands received from the memory controller and/or a host (not shown) to control logic 212 and status information received from control logic 212 to the memory controller and/or the host. Interface 216 can also be coupled to page buffer 204 and column decoder/bit line driver 206 via data bus 218 and act as an Input/Output (I/O) interface and a data buffer to buffer and relay the program data received from the memory controller and/or the host to page buffer 204 and the read data from page buffer 204 to the memory controller and/or the host. In some implementations, interface 216 and data bus 218 are part of an I/O circuit of peripheral circuits 102.

FIG. 3 illustrates a cross-sectional view of an exemplary 3D memory device 300 (corresponding to or included in 3D memory device 100 in FIG. 1), according to some implementations of the present disclosure. 3D memory device 300 may include one or more memory blocks (e.g., first memory block 303 and second memory block 305, also called first stack structure 303 and second stack structure 305). Each memory block may include one or more memory strings, e.g., first memory string 331 and second memory string 333 (e.g., corresponding to 3D NAND memory strings 108 in FIG. 1), extending in a first direction (e.g., a z-direction or a vertical direction). One or more channel structures 310 may be formed in each memory block. The intersections of channel structures 310 and the word lines (e.g., first conductive layers 303-1 or second conductive layers 305-1) may form one or more memory cells (e.g., corresponding to memory cells 106 in FIG. 1) in the memory blocks/strings.

In some implementations, each of channel structures 310 may include a channel hole filled with a semiconductor layer (e.g., as a semiconductor channel) and a composite dielectric layer (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. The remaining space of the channel structure can be partially or fully filled with a capping layer including dielectric materials, such as silicon oxide, and/or an air gap. The channel structure can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO).

In some implementations, channel structure 310 further includes a top channel plug 311-1 in the top portion (e.g., at the upper end) of channel structure 310 or a bottom channel plug 311-3 in the bottom portion (e.g., at the lower end) of channel structure 310. As used herein, the "upper end" of a component (e.g., the channel structure) is the end farther away from a substrate in the z-direction, and the "lower end" of the component (e.g., the channel structure) is the end closer to the substrate in the z-direction when the substrate is positioned in the lowest plane of 3D memory device 300. The channel plug can include semiconductor materials (e.g., polysilicon). In some embodiments, the channel plug functions as the drain of the NAND memory string.

3D memory device 300 includes a memory array portion 301 (e.g., corresponding to memory cell array 101 in FIG. 1) and a transistor portion 302 (e.g., corresponding to peripheral circuit 102 in FIG. 1) coupled to memory array portion 301. Memory array portion 301 may include a first semiconductor layer (e.g., a substrate or a later-formed layer after removing the substrate), first stack structure 303 of interleaved first dielectric layers 303-3 and first conductive layers 303-1, second stack structure 305 of interleaved second dielectric layers 305-3 and second conductive layers 305-1 formed on the semiconductor layer, and an ACS film 355 formed between first stack structure 303 and second stack structure 305. In some implementations, first dielectric layers 303-3, first conductive layers 303-1, second dielectric layers 305-3, second conductive layers 305-1, and/or ACS film 355 may extend in a second direction (e.g., x-direction) or a third (e.g., y-direction) perpendicular to the first direction. In some implementations, a material of conductive layers (e.g., 303-1 and 305-1) includes tungsten (W), cobalt (Co), copper (Cu), aluminum (Al), polycrystalline silicon (polysilicon or poly-Si), doped silicon, silicides, or any combination thereof. In some implementations, a material of dielectric layers (e.g., 303-3 and 305-3) includes dielectric materials including, but not limited to, silicon oxide, silicon nitride, silicon oxynitride, or any combination thereof. In some implementations, ACS film 355 may include a first ACS layer 355-1, a middle ACS layer 355-5, and a second ACS layer 355-3. The material of first ACS layer 355-1 and second ACS layer 355-3 include poly-Si, e.g., undoped poly-Si. And middle ACS layer 355-5 may include doped poly-Si, e.g., p-doped poly-Si.

In some implementations, channel structure 310 includes a first portion embedded laterally (e.g., in the x- or y-direction) in first stack structure 303, a second portion embedded laterally (e.g., in the x- or y-direction) in an ACS film 355, and a third portion embedded laterally (e.g., in x- or y-direction) in second stack structure 305. The second portion is between the first portion and the third portion. In some implementations, the second portion extends vertically (e.g., in the z-direction) further into among first stack structure 303 and/or among second stack structure 305. In some implementations, a width (e.g., a length extending laterally in the x- or y-direction) of the first portion of channel structure 310 increases from an end near top channel plug 311-1 to another end near the second portion. A width (e.g., a length extending laterally in the x- or y-direction) of the second portion of channel structure 310 increases from an end near the first portion of channel structure 310 to another end near the third portion. A width (e.g., a length extending laterally in the x- or y-direction) of the third portion of channel structure 310 increases from an end near the second portion of channel structure 310 to another end near bottom channel plug 311-3. In some implementations, a maximum width of the second portion of channel structure 310 is larger than a minimum width of the third portion of channel structure 310. A minimum width of the second portion of channel structure 310 is smaller than a maximum width of the first portion of channel structure 310. As such, the first portion, the second portion, and the third portion of channel structure 310 form zagged, jagged, twisted, or unevenly cut side walls in a cross-sectional view.

3D memory device 300 may include a gate line slit structure 309 extending through first stack structure 303 and second stack structure 305. In some implementations, gate line slit structure 309 may include a gate line slit layer and a space layer covering an outer surface of the gate line slit layer. In some implementations, the material of the space layer includes $SiO_2$, and a material of the gate line slit layer includes poly-Si. It is noted that the space layer can isolate the gate line slit layer from contacting the first/second conductive layers and/or the ACS film.

3D memory device 300 may include a first bit line 313 connected to top channel plug 311-1 in the top portion (e.g., at the upper end) of channel structure 310, and a second bit line 315 to bottom channel plug 311-3 in the bottom portion (e.g., at the lower end) of channel structure 310. A bit line contact structure 307 extending in the first direction (e.g., z-direction) is connected between first bit line 313 and second bit line 315. Bit line contact structure 307 can be formed in a region other than that of first stack structure 303 or second stack structure 305, e.g., a region of a plane edge of 3D memory device 300. In some implementations, a material of bit line contact structure 307 includes a conductive material including W, Co, Cu, Al, or any combination thereof. In some implementations, one or more memory array bonding contacts 340 may be formed in contact with a bonding interface between memory array portion 301 and transistor portion 302. In some implementations, each of one or more memory array interconnect layers may be formed between the memory array bonding contacts and the bit lines (e.g., first bit line 313 or second bit line 315), or between the memory array bonding contacts and ACS film 355, such that it can electrically connect between the memory cells of the memory cell array and the transistors of the peripheral circuit, or between the memory cells and other voltage sources (e.g., via fan-out pads or other wires). In some implementations, the transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, the peripheral circuits may further include any other circuits compatible with the advanced logic processes including logic circuits, such as processors and programmable logic devices (PLDs), or memory circuits, such as static random-access memory (SRAM) and dynamic RAM (DRAM).

Transistor portion 302 may include a second semiconductor layer 302-3 and one or more transistors 302-1 formed on second semiconductor 302-3. In some implementations, one or more peripheral bonding contacts may be formed in contact with the bonding interface between memory array portion 301 and transistor portion 302. In some implementations, one or more memory array bonding contacts may be formed in contact with the bonding interface between memory array portion 301 and transistor portion 302. In some implementations, each of one or more peripheral interconnect layers may be formed between the peripheral bonding contacts and terminals of transistors 302-1, such that it can electrically connect between the transistors of the peripheral circuit and the memory cells of the memory cell array, or between the transistors and other voltage sources (e.g., via fan-out pads or other wires).

To control the operation of 3D memory device 300, a first top select gate (TSG) 321-1 of first memory block 303 and a second TSG 323-1 of second memory block 305 can be used to realize the operations (e.g., read/program/verify) of memory cells in first memory block 303 and second memory block 305. In some implementations, in a gate-induced drain-leakage (GIDL) erase scheme, since the two bit lines (e.g., first bit line 313 and second bit line 315) are connected to a drain end (e.g., DSG transistor 112), by applying a high voltage level (e.g., 20 V) to the bit lines, applying a high voltage level (e.g., 20 V) to a source end (e.g., ACS film 355), and applying a ground voltage to a gate end (e.g., the word lines, for example, first conductive layers 303-1 or second conductive layers 305-1), the data stored in the memory cells can be erased in a single operation. And by applying program voltage (Vpgm) and/or current through the two bit lines (either commonly or respectively), applying pass voltage (Vpass) to unselected word lines, applying program voltages to selected word lines, and applying a ground voltage or a low bias voltage to ACS film 355, the data can be written into the memory cells of the memory strings/blocks.

Figure 4A:
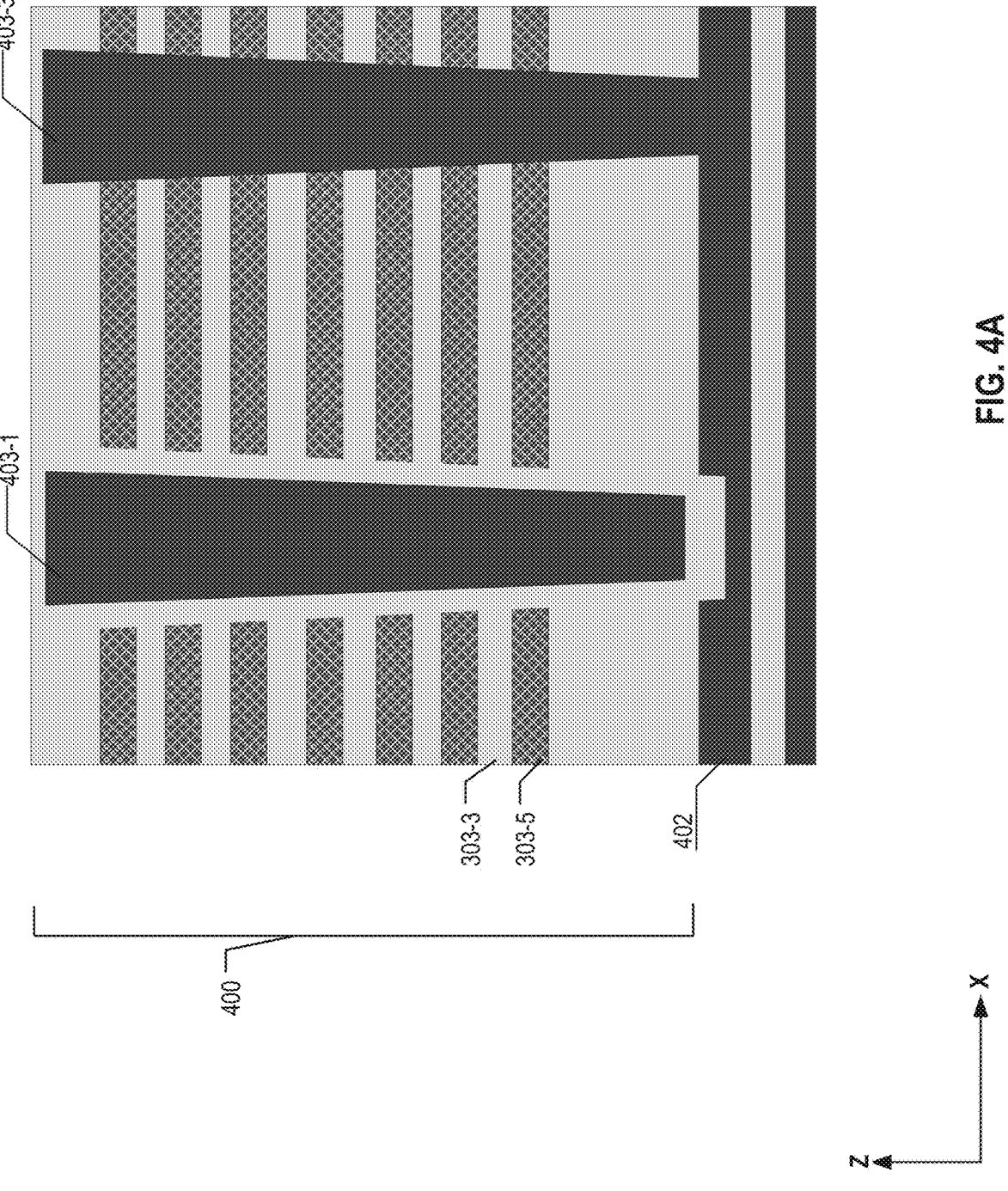
FIGS. 4A-4U illustrate fabrication processes for forming an exemplary 3D memory device, according to some aspects of the present disclosure.

FIGS. 4A-4U illustrate fabrication operations for forming an exemplary 3D memory device, according to some aspects of the present disclosure. FIG. 5 illustrates a flowchart of an exemplary method for forming a 3D memory device, according to some aspects of the present disclosure. Examples of the 3D memory device depicted in FIGS. 4A-4U include 3D memory device 100 in FIG. 1, or 3D memory device 300 in FIG. 13. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 501, in which a first substrate is provided, a first semiconductor structure is formed on the first substrate, a sacrificial ACS film is formed on the first semiconductor structure, a second semiconductor structure is formed on the sacrificial ACS film. The first semiconductor structure includes alternating first dielectric layers and first sacrificial layers. The second semiconductor structure includes alternating second dielectric layers and second sacrificial layers. A first sacrificial channel layer and a first sacrificial gate line slit layer may extend through the first semiconductor structure.

As shown in FIG. 4A, a first substrate 402 is provided. It is understood that since first substrate 402 will be removed from the final product, first substrate 402 may be part of a dummy wafer, for example, a carrier substrate, made of any suitable materials, such as glass, sapphire, plastic, silicon, to name a few, to reduce the cost of first substrate 402. In some implementations, first substrate 402 is a carrier substrate.

Next, a first semiconductor structure 400 is formed on first substrate 402. First semiconductor structure 400 includes alternating first dielectric layers 303-3 and first sacrificial layers 303-5. In some implementations, as shown in FIG. 4A, a first channel sacrificial layer 403-1 and a first gate line slit layer 403-3 can be formed extending into first semiconductor structure 400 until first substrate 402. In some implementations, first channel sacrificial layer 403-1 may extend to a top surface of first substrate 402, extend into first substrate 402, or extend toward first substrate 402 but has not yet reach to the top surface of first substrate 402. To form first channel sacrificial layer 403-1 and first gate line slit layer 403-3, wet etching and/or dry etching, e.g., reactive ion etching (RIE) can be applied to first semiconductor structure 400 to form etching holes. And then, one or more thin film deposition processes, such as atomic layer deposition (ALD), physical vapor deposition (PVD), and chemical vapor deposition (CVD), any other suitable processes, or any combination thereof, can be used to fill the etching holes to form first channel sacrificial layer 403-1 and first gate line slit layer 403-3.

Figure 4B:
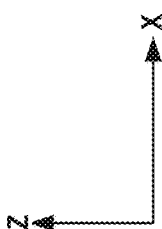

Next, as shown in FIG. 4B, a sacrificial ACS film 420 is formed on first semiconductor structure 400. Sacrificial ACS film 420 may include a composite layer of poly-silicon/silicon nitride/poly-silicon (poly-Si/SiN/poly-Si), or a composite layer of poly-silicon/silicon oxide/silicon nitride/silicon oxide/poly-silicon (poly-Si/SiO$_2$/SiN/SiO$_2$/poly-Si). To form sacrificial ACS film 420, one or more thin film deposition processes, such as ALD, PVD, and CVD, any other suitable processes, or any combination thereof, can be used to deposit a first ACS layer 405-1 (e.g., corresponding to 355-3 in FIG. 3), a second ACS layer 405-3 (e.g., corresponding to 355-1 in FIG. 3), and a middle sacrificial ACS layer 407 between first ACS layer 405-1 and second ACS layer 405-3. The material of middle sacrificial ACS layer 407 includes SiN, and the material of first ACS layer 405-1 and/or second ACS layer 405-3 includes poly-Si. In some implementations, an additional etching stop layer (e.g., SiO$_2$) can be formed between middle sacrificial ACS layer 407 and first ACS layer 405-1, and/or between middle sacrificial ACS layer 407 and second ACS layer 405-3, such that it can provide a better etching stop control in the later operations.

Figure 4C:

Next, as shown in FIG. 4C, an ACS etching hole 401-5 is formed extending through sacrificial ACS film 420 until first channel sacrificial layer 403-1. In some implementations, ACS etching hole 401-5 can be etched until a top portion of first channel sacrificial layer 403-1. This can be done by wet etching, dry etching, or a combination thereof.

Figure 4D:
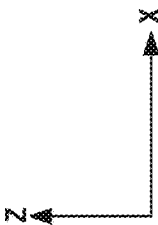

Next, as shown in FIG. 4D, a second channel sacrificial layer 403-5 can be deposited in ACS etching hole 401-5. In some implementations, the material of second channel sacrificial layer 403-5 is the same as that of first channel sacrificial layer 403-1.

Figure 4E:
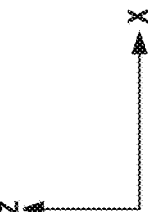

Next, as shown in FIG. 4E, second semiconductor structure 410 is formed on sacrificial ACS film 420. Second semiconductor structure 410 includes alternating second dielectric layers 305-3 and second sacrificial layers 305-5. In some implementations, as shown in FIG. 4E, a second channel etching hole 401-7 can be formed extending into second semiconductor structure 410 until second channel sacrificial layer 403-5 by wet etching, dry etching, or a combination thereof.

Referring to FIG. 5, method 500 proceeds to operation 503, in which a first channel hole is formed extending through the first semiconductor structure, the sacrificial ACS film, and the second semiconductor structure, and forming a channel structure in the first channel hole.

Figure 4F:
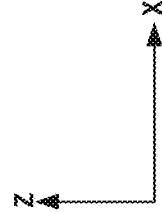

As shown in FIG. 4F, a first channel hole 401-9 extending into second semiconductor structure 410, sacrificial ACS film 420, and first semiconductor structure 400, can be formed by applying one or more etching processes to remove second channel sacrificial layer 403-5 and first channel sacrificial layer 403-1. In some implementations, second channel sacrificial layer 403-5 and first channel sacrificial layer 403-1 may include carbon or carbon-doped material. As such, second channel sacrificial layer 403-5 and first channel sacrificial layer 403-1 may be removed by applying a heat, e.g., a thermal process, to burn off the carbon or carbon-doped material. In some implementations, the process of forming of first channel sacrificial layer 403-1 and second channel sacrificial layer 403-5 can also be omitted, and the process of forming first channel hole 401-9 can be done by forming first semiconductor structure 400, forming sacrificial ACS film 420 on first semiconductor structure 400, and forming second semiconductor structure 410 on sacrificial ACS film 420, and then applying an etching process to form first channel hole 401-9 extending into second semiconductor structure 410, sacrificial ACS film 420, and first semiconductor structure 400 until first substrate 402.

Figure 4G:
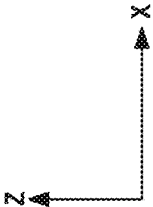

Next, as shown in FIG. 4G, a channel structure 409 (e.g., corresponding to channel structures 310 in FIG. 3) is formed in first channel hole 401-9. In some implementations, to form channel structure 409, a semiconductor channel and a composite dielectric layer (e.g., as a memory film) can be deposited into first channel hole 401-9. In some implementations, the semiconductor channel includes silicon, such as amorphous silicon, polysilicon, or single crystalline silicon. In some implementations, the memory film is a composite layer including a tunneling layer, a storage layer (e.g., charge trap layer), and a blocking layer. The remaining space of the channel structure can be partially or fully filled with a capping layer including dielectric materials, such as silicon oxide, and/or an air gap. The channel structure can have a cylinder shape (e.g., a pillar shape). The capping layer, the semiconductor channel, the tunneling layer, the storage layer, and the blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (an ONO film).

Referring to FIG. 5, method 500 proceeds to operation 505, in which a first gate line slit hole extending through the second semiconductor structure until the sacrificial ACS film, and replacing the sacrificial ACS film with an ACS film.

Figure 4H:
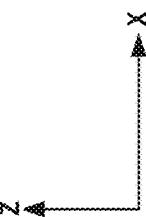

As shown in FIG. 4H, a first gate line slit hole 401-11 is formed and extends through second semiconductor structure 410 until sacrificial ACS film 420. In some implementations, first gate line slit hole 401-11 extends until a top portion of second ACS layer 405-3 and does not reach to middle sacrificial ACS layer 407.

Figure 4I:

Next, as shown in FIG. 4I, a first etch stop layer 405-5 is formed in first gate line slit hole 401-11 and covers the sidewalls and the bottom of first gate line slit hole 401-11. A second etch stop layer 405-7 is formed on first etch stop layer 405-5. In some implementations, the material of first etch stop layer 405-5 includes poly-silicon (poly-Si), and a material of second etch stop layer 405-7 includes silicon oxide (SiO$_2$).

Figure 4J:
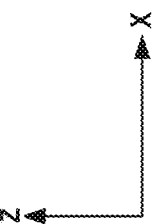

Next, as shown in FIG. 4J, an etching process (e.g., dry etching) may be applied to a bottom portion of second etch stop layer 405-7 to punch through second etch stop layer 405-7 until a portion of middle sacrificial ACS layer 407.

Figure 4K:
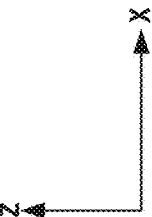

Next, as shown in FIG. 4K, middle sacrificial ACS layer 407 is removed by using one or more etching processes (e.g., wet etching, dry etching, or a combination thereof). Since the material of first ACS layer 405-1 and second ACS layer 405-3 are different from that of middle sacrificial ACS layer 407, by using a different etching solvent (or etching agent) to wet etch middle sacrificial ACS layer 407, only middle sacrificial ACS layer 407 will be removed, and first ACS layer 405-1 and second ACS layer 405-3 (or even the additional etching stop layers (e.g., SiO$_2$) formed between middle sacrificial ACS layer 407 and first ACS layer 405-1, or between middle sacrificial ACS layer 407 and second ACS layer 405-3) will remain in place.

Figure 4L:
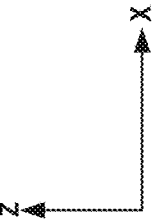

Next, as shown in FIG. 4L, the ONO film of the memory film is etched through from the sides of channel structure 409 to expose the semiconductor channel. In some implementations, the etching process may be performed by using selective etching solutions, such that the ONO film of the memory film is partially removed to expose the sidewalls of the semiconductor channel without removing the semiconductor channel. Furthermore, as shown in FIG. 4L, the additional etching stop layers (e.g., $SiO_2$) formed between middle sacrificial ACS layer 407 and first ACS layer 405-1, or between middle sacrificial ACS layer 407 and second ACS layer 405-3), are also removed in the same etching process. In some implementations, second etch stop layer 405-7 is also removed in the same etching process. In some implementations, because the material of first etch stop layer 405-5 includes poly-Si, the material of semiconductor channel includes silicon, such as amorphous silicon, poly-Si, or single crystalline silicon, and the material of first ACS layer 405-1 and second ACS layer 405-3 include poly-Si, the selective etching may selectively remove only or largely SiN and/or $SiO_2$, while leaves the silicon or poly-Si unharmed.

Figure 4M:
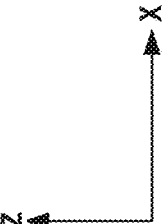

Next, as shown in FIG. 4M, after removing middle sacrificial ACS layer 407 as in FIG. 4K and removing the ONO film as in FIG. 4L, a middle ACS layer 407-1 (e.g., corresponding to 355-5 in FIG. 3) is deposited via first gate line slit hole 401-11. In some implementations, middle ACS layer 407-1 includes poly-Si. In some implementations, middle ACS layer 407-1 may be doped material including p-doped poly-Si. To deposit middle ACS layer 407-1, one or more thin film deposition processes, such as ALD, PVD, and CVD, any other suitable processes, or any combination thereof, can be used to fill the vacancy. Since middle ACS layer 407-1 is filled into the vacancy to replace middle sacrificial ACS layer 407, middle ACS layer 407-1 is also in contact with the semiconductor channel of channel structure 409.

Figure 4N:
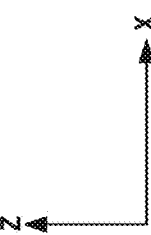
Figure 40:
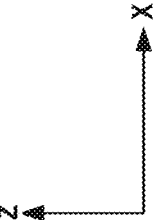

In some implementations, as shown in FIG. 4M, the sidewalls of first etch stop layer 405-5 may also have the material of middle ACS layer 407-1 deposited remaining thereon. As such, as shown in FIG. 4N, the deposit residues of middle ACS layer 407-1 remaining on the sidewalls of first etch stop layer 405-5 may be removed by a wet etching or a dry etching simultaneously with the removal of first etch stop layer 405-5. In some implementations, the etching to remove the deposit residues further includes removing a portion of middle ACS layer 407-1.

Referring to FIG. 5, method 500 proceeds to operation 507, in which a second gate line slit hole is formed extending through the first semiconductor structure to remove the first sacrificial gate line slit layer. The first and second sacrificial layers are replaced with first and second conductive layers, and a gate line slit layer is formed in the first/second gate line slit hole.

Figure 4P:
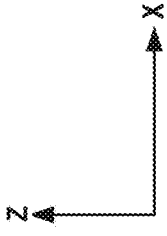

As shown in FIG. 4O and FIG. 4P, a second gate line slit hole 403-13 (as shown in FIG. 4P) is formed extending through first semiconductor structure 400 to remove first sacrificial gate line slit layer 403-3 (as shown in FIG. 4O). In some implementations, one or more etching processes (e.g., wet etching, dry etching, or a combination thereof) may be applied to form second gate line slit hole 403-13. In some implementations, first gate line slit hole 401-11 and second gate line slit hole 403-13 can be formed in a single etching process, e.g., a dry etching process.

Figure 4Q:
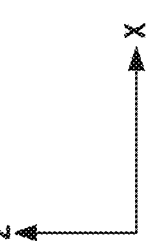

Next, as shown in FIG. 4Q, a gate replacement operation is applied to first semiconductor structure 400 and second semiconductor structure 410 such that first sacrificial layers 303-5 and second sacrificial layers 305-5 are replaced by first conductive layers 303-1 and second conductive layers 305-1. In particular, one or more etching processes (e.g., wet etching, dry etching, or a combination thereof) may be applied via first gate line slit hole 401-11 and second gate line slit hole 403-13 to remove first sacrificial layers 303-5 and second sacrificial layers 305-5, while leaving first dielectric layers 303-3 and second dielectric layers 305-3 in place. Next, one or more deposition processes (e.g., ALD, PVD, and CVD, any other suitable processes, or any combination thereof) may be applied to fill the gaps between first dielectric layers 303-3 and second dielectric layers 305-3, to form first conductive layers 303-1 and second conductive layers 305-1.

Next, also as shown in FIG. 4Q, a gate line slit structure 309 is then formed in first gate line slit hole 401-11 and second gate line slit hole 403-13 by one or more deposition processes, e.g., ALD, PVD, and CVD, any other suitable processes, or any combination thereof. In some implementations, to form gate line slit structure 309, the space layer (e.g., $SiO_2$) and the gate line slit layer (e.g., poly-Si) can be sequentially deposited in first gate line slit hole 401-11 and second gate line slit hole 403-13.

Referring to FIG. 5, method 500 proceeds to operation 509, in which a first bit line is formed and coupled to a first end of the channel structure, the second semiconductor structure is bonded to a third semiconductor structure, the first substrate is removed, and a second bit line is formed and coupled to a second end of the channel structure.

Figure 4R:
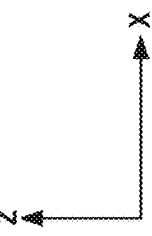

As shown in FIG. 4R, a bit line contact structure 307 can be formed in a plane edge of the 3D memory device. Bit line contact structure 307 is formed extending through memory array portion 301 in the z-direction until first substrate 402. To form bit line contact structure 307, one or more etching processes and one or more thin film deposition processes may be performed.

Next, also as shown in FIG. 4R, a second bit line 315 is formed on second semiconductor structure 410 and extends in the second or third direction (e.g., x- or y-direction). Second bit line 315 is coupled to a first end of channel structure 409 via a first contact 411-1 (corresponding to bottom channel plug 311-3 as in FIG. 3). In some implementations, a first ion-implantation region 411 can be formed on a top portion at the first end of channel structure 409. To form first ion-implantation region 411, an ion-implantation process may be performed on the top portion at the first end of channel structure 409, and then an activation process may be performed on that portion. The activation process may include a thermal activation treatment or a laser activation treatment. It should be noted that the temperature of laser activation treatment is lower than that of thermal activation treatment. In practical applications, the activation process can be selected according to actual needs so as to avoid the influence of the activation process temperature on the subsequent process. First ion-implantation region 411 can be a doped region, e.g., an N-type doped region or a P-type doped region.

In some implementations, before forming first ion-implantation region 411, an etching process can be applied to form a through hole from the top of second semiconductor structure 410 to the semiconductor channel of channel structure 409. In some implementations, after forming first ion-implantation region 411, first contact 411-1 can be formed in contact with first ion-implantation region 411, and then second bit line 315 is formed in contact with first contact 411-1. In some implementations, the ion-implantation depth can be adjusted to control the doping depth accordingly. It is also noted that the doping depth is not limited to the present disclosure. Different doping depths, doping concentrations, or doping profiles can be set according to the actual requirements of the memory device. Among them, the doping depth can be controlled by adjusting the acceleration energy of the ion beam. The doping concentration, that is, the impurity dose, can be controlled by monitoring the ion current during implantation. The doping impurity distribution can be adjusted by simultaneously adjusting the ion implantation energy and ion implantation dose to control. Therefore, by using the ion implantation process for doping, the doping concentration, doping depth, and doping impurity distribution can be controlled more accurately with repeatability. In some implementations, the doping concentration of the semiconductor channels of the channel structures can be between $1\times10^{13}$ cm$^{-3}$ and $1\times10^{23}$ cm$^{-3}$ (e.g., $1\times10^{13}$, $1\times10^{14}$, $1\times10^{15}$, $1\times10^{16}$, $1\times10^{17}$, $1\times10^{18}$, $1\times10^{19}$, $1\times10^{20}$, $1\times10^{21}$, $1\times10^{22}$, $1\times10^{23}$, or any range bounded by the lower end by any of these values, or in any range defined by any two of these values). In some implementations, the depth of the semiconductor channels of the channel structures can be between 0 nm and 500 nm (e.g., 50 nm, 100 nm, 150 nm, 200 nm, 250 nm, 300 nm, 350 nm, 400 nm, 450 nm, 500 nm, or any range bounded by the lower end by any of these values, or in any range defined by any two of these values).

Figure 4S:
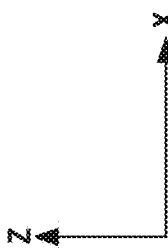

Next, as shown in FIG. 4S, second semiconductor structure 410 is bonded to a third semiconductor structure 430. Third semiconductor structure 430 is transistor portion 302 of the 3D memory device. To form third semiconductor structure 430, a second semiconductor layer 302-3 is provided, and one or more transistors 302-1 are formed on second semiconductor 302-3. And then, second semiconductor structure 410 can be bonded to third semiconductor structure 430 in a face-to-face manner at a bonding interface. In some implementations, the bonding interface is disposed between bonding layers as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, the bonding interface is the place at which bonding layers are met and bonded. In practice, the bonding interface can be a layer with a certain thickness that includes the bottom surface of the bonding layer of second semiconductor structure 410 and the top surface of the bonding layer of third semiconductor structure 430.

Next, as shown in FIG. 4T, after the bonding process, first substrate 402 (as in FIG. 4S) can be removed to expose first semiconductor structure 400, and/or bit line contact structure 307. To remove first substrate 402, one or more etching processes, e.g., a wet etching process, may be performed.

Next, as shown in FIG. 4U, a first bit line 313 is formed on first semiconductor structure 400 and extends in the second or third direction (e.g., x- or y-direction). First bit line 313 is coupled to a second end of channel structure 409 via a second contact 413-1 (corresponding to top channel plug 311-1 as in FIG. 3). In some implementations, a second ion-implantation region 413 can be formed on a top portion at the second end of channel structure 409. To form second ion implantation region 413, an ion-implantation process may be performed on the top portion at the second end of channel structure 409, and then an activation process may be performed on that portion. In some implementations, before forming second ion-implantation region 413, an etching process can be applied to form a through hole from the top of first semiconductor structure 400 to the semiconductor channel of channel structure 409. In some implementations, after forming second ion-implantation region 413, second contact 413-1 can be formed in contact with second ion-implantation region 413, and then first bit line 313 is formed in contact with second contact 413-1. Second ion-implantation region 413 can be a doped region, e.g., an N-type doped region or a P-type doped region.

FIG. 6 illustrates a block diagram of an exemplary system 600 having a 3D memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more 3D memory devices 604 and a memory controller 606. Host 608 can be a processor of an electronic device, such as a central processing unit (CPU), or a system-on-chip (SoC), such as an application processor (AP). Host 608 can be configured to send or receive data to or from 3D memory devices 604.

3D memory device 604 can be any 3D memory devices disclosed herein, such as 3D memory devices 100 and 300 shown in FIGS. 1 and 3. In some implementations, each 3D memory device 604 includes a NAND Flash memory.

Memory controller 606 is coupled to 3D memory device 604 and host 608 and is configured to control 3D memory device 604, according to some implementations. Memory controller 606 can manage the data stored in 3D memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of 3D memory device 604, such as read, erase, and program operations. Memory controller 606 can also be configured to manage various functions with respect to the data stored or to be stored in 3D memory device 604 including, but not limited to bad-block management, garbage collection, logical-to-physical address conversion, wear leveling, etc. In some implementations, memory controller 606 is further configured to process error correction codes (ECCs) with respect to the data read from or written to 3D memory device 604. Any other suitable functions may be performed by memory controller 606 as well, for example, formatting 3D memory device 604. Memory controller 606 can communicate with an external device (e.g., host 608) according to a particular communication protocol. For example, memory controller 606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 606 and one or more 3D memory devices 604 can be integrated into various types of storage devices, for example, be included in the same package, such as a universal Flash storage (UFS) package or an eMMC package. That is, memory system 602 can be implemented and packaged into different types of end electronic products.

In one example as shown in FIG. 7A, memory controller 606 and a single 3D memory device 604 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 702 can further include a memory card connector 704 electrically coupling memory card 702 with a host (e.g., host 608 in FIG. 6). In another example as shown in FIG. 7B, memory controller 606 and multiple 3D memory devices 604 may be integrated into an SSD 706. SSD 706 can further include an SSD connector 708 electrically coupling SSD 706 with a host (e.g., host 608 in FIG. 6). In some implementations, the storage capacity and/or the operation speed of SSD 706 is greater than those of memory card 702.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A three-dimensional (3D) memory device, comprising:
a first semiconductor structure comprising alternating first dielectric layers and first conductive layers;
an array common source (ACS) film over the first semiconductor structure;
a second semiconductor structure over the ACS film, wherein the second semiconductor structure comprises alternating second dielectric layers and second conductive layers; and
a channel structure extending in the first semiconductor structure, the ACS film, and the second semiconductor structure in a first direction, wherein the channel structure is connected to the ACS film.

2. The 3D memory device of claim 1, further comprising:
a contact structure coupled between a first end of the channel structure and a second end of the channel structure.

3. The 3D memory device of claim 2, further comprising:
a first bit line extending in a second direction perpendicular to the first direction, wherein the contact structure coupled to the first end of the channel structure via the first bit line; and
a second bit line extending in the second direction, wherein the contact structure coupled to the second end of the channel structure via the second bit line.

4. The 3D memory device of claim 3, wherein the first bit line is in contact with a first doped portion of the channel structure at the first end of the channel structure, and the second bit line is in contact with a second doped portion of the channel structure at the second end of the channel structure.

5. The 3D memory device of claim 4, wherein a doping type of the first doped portion and that of the ACS film are the same, or a doping type of the second doped portion and that of the ACS film are the same.

6. The 3D memory device of claim 1, further comprising:
a first interlayer between the ACS film and the first semiconductor structure; and
a second interlayer between the ACS film and the second semiconductor structure.

7. The 3D memory device of claim 1, wherein the ACS film comprises p-doped polysilicon.

8. The 3D memory device of claim 1, wherein the ACS film is formed between the first semiconductor structure and the second semiconductor structure.

9. The 3D memory device of claim 1, wherein the channel structure comprises a first portion, a second portion, and a third portion between the first portion and the second portion, wherein the first portion extends in the first semiconductor structure, the second portion extends in the second semiconductor structure, and the third portion connected to the ACS film.

10. The 3D memory device of claim 1, wherein the channel structure further comprises a channel layer, wherein the ACS film is in contact with the channel layer.

11. The 3D memory device of claim 10, wherein the channel structure further comprises a memory film at least partially surrounds the channel layer, wherein the memory film comprises a tunneling layer, a storage layer, and a blocking layer arranged radially from inside out.

12. The 3D memory device of claim 11, wherein the channel layer further comprises an exposed portion not covered by the memory film, and the ACS film is in contact with the channel layer via the exposed portion.

13. The 3D memory device of claim 1, further comprising:
a third semiconductor structure, comprising:
a peripheral circuit; and
a first bonding layer, wherein the first semiconductor structure and the third semiconductor structure are bonded via the first bonding layer.

14. A memory system, comprising:
a three-dimensional (3D) memory device, comprising:
a first semiconductor structure comprising alternating first dielectric layers and first conductive layers;
an array common source (ACS) film over the first semiconductor structure;
a second semiconductor structure over the ACS film, wherein the second semiconductor structure comprises alternating second dielectric layers and second conductive layers; and
a channel structure extending in the first semiconductor structure, the ACS film, and the second semiconductor structure in a first direction, wherein the channel structure is electrically connected to the ACS film; and
a memory controller coupled to the 3D memory device and configured to control operations of the 3D memory device.

* * * * *